(12) United States Patent
Stark

(10) Patent No.: US 8,269,096 B2
(45) Date of Patent: Sep. 18, 2012

(54) LOW POWER THERMOELECTRIC GENERATOR

(76) Inventor: Ingo Stark, Riverside, CA (US)

( * ) Notice: Subject to any disclaimer, the term of this patent is extended or adjusted under 35 U.S.C. 154(b) by 56 days.

(21) Appl. No.: 12/242,810

(22) Filed: Sep. 30, 2008

(65) Prior Publication Data

US 2009/0025771 A1 Jan. 29, 2009

Related U.S. Application Data

(60) Division of application No. 11/352,113, filed on Feb. 10, 2006, now Pat. No. 7,629,531, which is a continuation-in-part of application No. 11/185,312, filed on Jul. 20, 2005, now abandoned, which is a continuation of application No. 10/440,992, filed on May 19, 2003, now Pat. No. 6,958,443.

(51) Int. Cl.
*H01L 35/34* (2006.01)
(52) U.S. Cl. ........................................ 136/201
(58) Field of Classification Search .............. 136/201
See application file for complete search history.

(56) References Cited

U.S. PATENT DOCUMENTS

| | | | |
|---|---|---|---|
| 2,694,098 A | 11/1954 | Leins | |
| 3,900,603 A * | 8/1975 | Rittmayer et al. | 148/537 |
| 3,923,551 A | 12/1975 | Purdy | |
| 4,802,929 A * | 2/1989 | Schock | 136/205 |
| 5,712,448 A | 1/1998 | Vandersande et al. | |
| 5,769,943 A | 6/1998 | Fleurial et al. | |
| 5,883,563 A | 3/1999 | Horio et al. | |
| 5,959,341 A | 9/1999 | Tsuno et al. | |
| 6,046,398 A | 4/2000 | Foote et al. | |
| 6,288,321 B1 | 9/2001 | Fleurial et al. | |
| 6,300,150 B1 | 10/2001 | Venkatasubramanian | |
| 6,329,696 B1 | 12/2001 | Tanaka | |
| 6,388,185 B1 | 5/2002 | Fleurial et al. | |
| 6,458,319 B1 | 10/2002 | Calliat et al. | |
| 6,812,395 B2 * | 11/2004 | Bell | 136/201 |

(Continued)

FOREIGN PATENT DOCUMENTS

CH 677421 A5 5/1991

(Continued)

OTHER PUBLICATIONS

Kim et al., "Effects of a Reduction Treatment and Te Doping Properties of (Bi1-xSbx)2Te3 Fabricated by Mechanical Alloying," 16th International Conference on Thermoelectrics, pp. 127-130, (1997).

(Continued)

*Primary Examiner* — Jennifer Michener
*Assistant Examiner* — Dustin Q Dam

(57) ABSTRACT

A thermoelectric generator has a top plate disposed in spaced relation above a bottom plate. A series of foil segments are electrically and mechanically connected end-to-end to generate a foil assembly that is spirally wound and in thermal contact with the bottom and top plates. Each foil segment comprises a substrate having a series of spaced alternating n-type and p-type thermoelectric legs disposed in parallel arrangement on the front substrate surface. Each of the n-type and p-type legs is formed of a bismuth telluride-based thermoelectric material having a thickness of about 10-100 microns, a width of about 10-100 microns and a length of about 100-500 microns. The alternating n-type and p-type thermoelectric legs are electrically connected in series and thermally connected in parallel such that a temperature differential between the bottom and top plates results in the generation of power.

6 Claims, 9 Drawing Sheets

U.S. PATENT DOCUMENTS

| | | |
|---|---|---|
| 7,594,982 B1 * | 9/2009 | Roscheisen et al. .......... 204/284 |
| 2002/0189661 A1 | 12/2002 | Caillat |
| 2003/0041892 A1 | 3/2003 | Fleurial et al. |
| 2003/0157799 A1 * | 8/2003 | Ding et al. .................... 438/687 |
| 2004/0058591 A1 | 3/2004 | Avazi et al. |
| 2004/0075167 A1 | 4/2004 | Nurnus |
| 2004/0094414 A1 * | 5/2004 | Engelhardt et al. ...... 204/403.14 |
| 2004/0144639 A1 * | 7/2004 | Chiang et al. ............ 204/192.15 |
| 2004/0231714 A1 * | 11/2004 | Stark et al. ................... 136/211 |
| 2005/0139250 A1 | 6/2005 | DeSteese |
| 2005/0252543 A1 | 11/2005 | Stark |
| 2006/0090787 A1 | 5/2006 | Onvural |
| 2006/0151021 A1 | 7/2006 | Stark |
| 2007/0256722 A1 * | 11/2007 | Kondoh ....................... 136/201 |
| 2008/0057611 A1 | 3/2008 | Stordeur et al. |

FOREIGN PATENT DOCUMENTS

| | | |
|---|---|---|
| DE | 6900274 | 8/1970 |
| DE | 2124465 | 11/1972 |
| DE | 2457586.1 | 6/1975 |
| DE | 3807633 | 9/1989 |
| DE | 29723309 | 9/1998 |
| DE | 29723309.2 | 9/1998 |
| DE | 10333084 | 2/2005 |
| DE | 102006040576.5 | 8/2006 |
| EP | 0034538 A2 | 8/1981 |
| EP | 0408572 B1 | 6/1993 |
| JP | S51-013587 | 2/1976 |
| JP | 53031985 | 3/1978 |
| JP | S53-031985 | 3/1978 |
| JP | H2-155280 | 6/1990 |
| JP | H3-201577 | 9/1991 |
| JP | H11-177154 | 7/1999 |
| JP | 2000-261052 | 9/2000 |
| JP | 2003179275 | 6/2003 |
| JP | 2004104041 | 4/2004 |
| JP | 2004241657 | 8/2004 |
| JP | 2006086510 | 3/2006 |
| WO | 89/07836 | 8/1989 |
| WO | WO2004105146 | 12/2004 |

OTHER PUBLICATIONS

M. Stolzer, "Crystalline structure and thermoelectric properties versus growing conditions of sputtering-deposited $(Bi_{1-x}Sb_x)_2Te_3$ films with $0<x<0.85$," Proceedings ICT 1997 XVI International Conference on Thermoelectrics 1997, Dresden, Germany Aug. 26-29, 1997, pp. 93-96, available at <http://ieexplore.ieee.org/articleSale/Sarticle.jsp?arnumber=666982>, last visited Apr. 4, 2009.

I. Stark et al., "New Micro thermoelectric. Devices Based on Bismuth Telluride-Type Thin Solids Films," Eighteenth International Conference On Thermoelectrics, 1999, Baltimore, Maryland, p. 465.

N. Sato, et al., "Novel MEMS power generator with integrated thermoelectric and vibrational devices," The 13th International Conference on Solid-State Sensors, Actuators and Microsystems,vol. 1, Issue , Jun. 5-9, 2005, pp. 295-298.

PCT/US2010/053612, International Search Report dated Dec. 21, 2010.

PCT International Search Report dtd Oct. 13, 2009 for PCT/US 2007003272.

First European Examination Report dtd Oct. 30, 2009 for PCT/US 2007003272.

Second European Examination Report dtd Jun. 7, 2011 for PCTUS 2007003272.

* cited by examiner

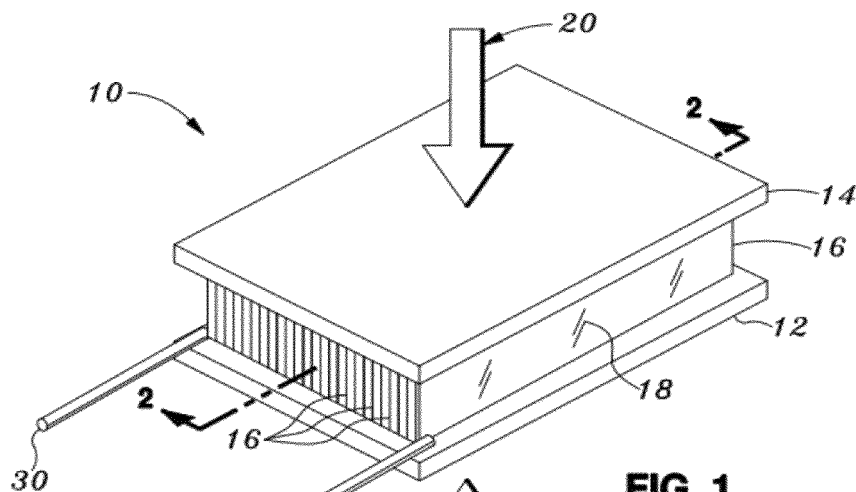
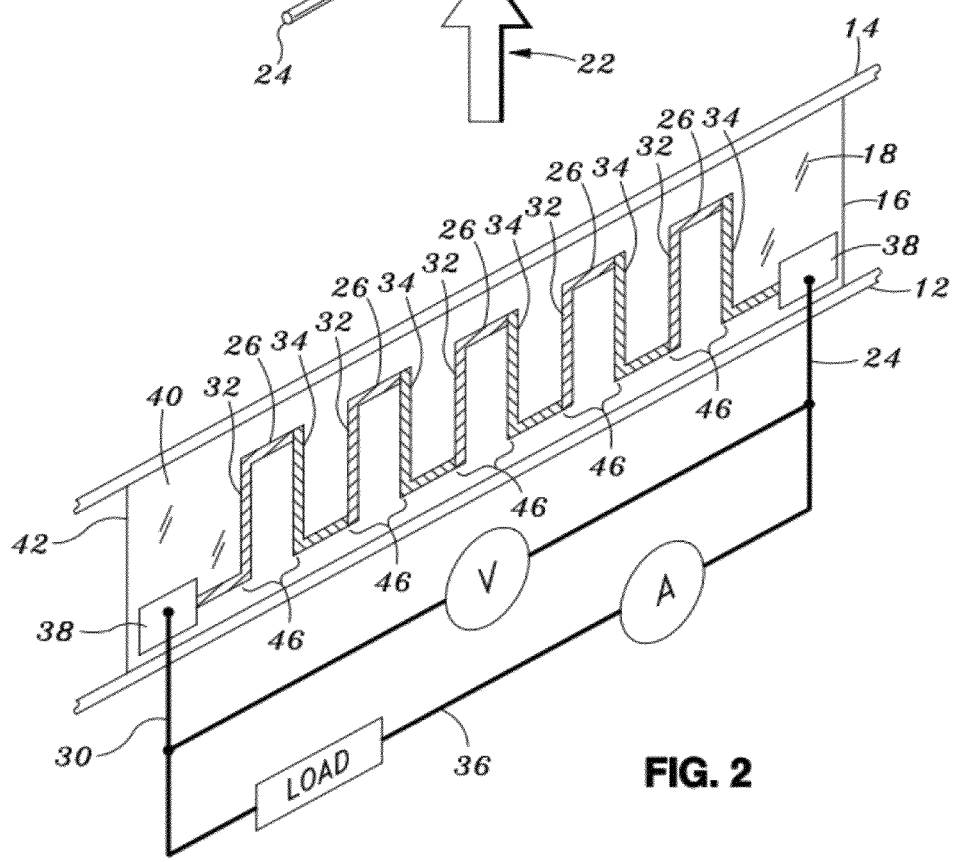

LOW POWER THERMOELECTRIC GENERATOR

CROSS-REFERENCE TO RELATED APPLICATIONS

The present application is a continuation of pending U.S. patent application Ser. No. 11/352,113 entitled IMPROVED LOW POWER THERMOELECTRIC GENERATOR filed on Feb. 10, 2006, which is a continuation-in-part application of U.S. patent application Ser. No. 11/185,312 entitled LOW POWER THERMOELECTRIC GENERATOR filed on Jul. 20, 2005, which is a continuation of U.S. patent application Ser. No. 10/440,992 entitled LOW POWER THERMOELECTRIC GENERATOR filed on May 19, 2003, now U.S. Pat. No. 6,958,443, the entire contents of each being expressly incorporated by reference herein.

STATEMENT RE: FEDERALLY SPONSORED RESEARCH/DEVELOPMENT (Not Applicable)

BACKGROUND OF THE INVENTION

The present invention pertains generally to thermoelectric devices and, more particularly, to a self-sufficient, low power thermoelectric generator having a compact size and a relatively high voltage output which is specifically adapted to be compatible with microelectronic devices.

The increasing trend toward miniaturization of microelectronic devices necessitates the development of miniaturized power supplies. Batteries and solar cells are traditional power sources for such microelectronic devices. However, the power that is supplied by batteries dissipates over time requiring that the batteries be periodically replaced. Solar cells, although having an effectively unlimited useful life, may only provide a transient source of power as the sun or other light sources may not always be available. Furthermore, solar cells require periodic cleaning of their surfaces in order to maintain efficiency of energy conversion.

Thermoelectric generators are self-sufficient energy sources that convert thermal energy into electrical energy under established physics principles. The Seebeck effect is a phenomenon whereby heat differences may be converted into electricity due in large part on charge carrier diffusion in a conductor. Electrical power may be generated under the Seebeck effect by utilizing thermocouples which are each comprised of a pair of dissimilar metals (n-type and p-type) joined at one end. N-type and p-type, respectively, refers to the negative and positive types of charge carriers within the material.

The temperature gradient that exists between the ends of the thermocouple may be artificially applied or it may be natural, occurring as "waste heat" such as heat that is constantly rejected by the human body. In a wristwatch, one side is exposed to air at ambient temperature while the opposite side is exposed to the higher temperature of the wearer's skin. Thus, a small temperature gradient is typically present across the thickness of the wristwatch. A thermoelectric generator may be incorporated into the wristwatch to take advantage of the waste heat and generate a supply of power sufficient to operate the wristwatch as a self-contained unit. Advantageously, many microelectronic devices that are similar in size to a typical wristwatch require only a small amount of power and are therefore also compatible for powering by a thermoelectric generator.

The operating parameters of a thermoelectric generator may be mathematically characterized in several ways. For example, the voltage measured across unjoined ends of a thermocouple is directly proportional to the temperature difference across the two ends. When n-type thermoelectric legs and p-type thermoelectric legs that make up a thermocouple are electrically connected in series but thermally connected in parallel with a temperature differential $T_1$ and $T_2$ maintained thereacross, the open circuit voltage V under the Seebeck effect may be mathematically expressed by the following formula:

$$V=S(T_1-T_2)$$

where S is the Seebeck coefficient expressed in microvolts per degree ($\mu$V/K).

The efficiency of thermoelectric generators may be characterized by a thermoelectric figure of merit (Z), traditionally defined by the following formula:

$$Z=S^2\sigma/\kappa$$

where $\sigma$ and $\kappa$ are the electrical conductivity and thermal conductivity, respectively. The figure of merit Z, expressed in reciprocal K, represents the thermal and electrical properties of a thermoelectric material that may be utilized in a thermoelectric generator. One of the keys to improve the efficiency of thermoelectric generators lies in the development of highly effective thermoelectric films having low electrical resistance, high Seebeck coefficient and low thermal conductivity.

Another key in improving thermoelectric generators lies in increasing the integration density of the thermocouples. Often with waste heat sources, only a small temperature difference exists between the heat source and the heat sink. Because of this small temperature difference, a large number of thermocouples must be connected in series in order to generate a sufficient thermoelectric voltage. Consequently, the thermocouples must have extreme aspect ratios of length to width of the cross-section.

The prior art includes a number of devices that attempt to improve the efficiency and operating characteristics of thermoelectric generators. One prior art device includes a heat-conducting substrate disposed in thermal contact with a high-temperature region opposite a low-temperature region. Heat flows from the high-temperature region into the heat-conducting substrate and into a number of alternating n-type and p-type thermoelectric legs cut from crystal material. The n-type and p-type thermoelectric legs are electrically connected in series and thermally connected in parallel. The n-type and p-type thermoelectric legs are formed on the substrate in a two-dimensional checkerboard pattern. Because total voltage is the sum of the individual voltages across each n-type and p-type pair, and because each thermocouple of n-type and p-type thermoelectric legs may produce only a few millivolts for a given temperature differential, a very large area is required in order to encompass the checkerboard pattern of alternating n-type and p-type thermoelectric legs. Such a large area requirement prevents the miniaturizing of the thermoelectric generator.

Another prior art device provides a thermoelectric module having a gapless insulating eggcrate for providing insulated spaces for a number of n-type and p-type thermoelectric legs. The absence of gaps eliminates the possibility of interwall electrical shorts between the thermoelectric legs. The thermoelectric legs are electrically connected in series and thermally connected in parallel between hot and cold sides of the module. Electrical connections are comprised of a layer of aluminum over a layer of molybdenum. The surfaces are ground down to expose the eggcrate walls except in the areas where the thermoelectric legs are interconnected. Although the module of the reference overcomes the problems of electrical shorts between adjacent thermoelectric legs, the device of the reference requires numerous manufacturing steps and is therefore costly.

Other prior art devices attempting to miniaturize thermoelectric generators have increased the integration density of thermocouples by miniaturizing the individual monolithic structures of the thermocouples. Although such devices succeeded in reducing the cross section of these bulk material bismuth telluride thermocouples to a sufficiently small size, the extreme difficulty in handling and fabricating these bismuth telluride-type thermocouples from bulk material translates into extremely high production costs leading to a very high cost of the final product.

In view of the above-described shortcomings of conventional thermoelectric generators, there exists a need in the art for a thermoelectric generator that is compatible with the requirements of microelectronic devices. More specifically, there exists a need for a thermoelectric generator for producing low power that is of compact size, and that is specifically adapted for producing a high output voltage while being mass-producible at a relatively low cost.

SUMMARY OF THE INVENTION

The present invention specifically addresses and alleviates the above referenced deficiencies associated with thermoelectric generators. More particularly, the present invention is an improved, self-sufficient, low power thermoelectric generator having a compact size and that is specifically adapted to be compatible with microelectronic devices.

Thermoelectric generators take advantage of a thermal gradient to generate useful power according to the Seebeck effect. The thermoelectric generator as disclosed herein is comprised of a bottom plate, a top plate, and a foil assembly comprising either a single, elongate foil segment or a series of foil segments that are joined end-to-end using connectors straddling each end-to-end joint. Adhesive may be utilized to bond the connector to at least one of the front and back substrate surfaces of the end-to-end foil segments in order to mechanically connect the foil segments. More specifically, the connector may be bonded to at least the front substrate surface. However, for a stronger mechanical connection, a connector may also be bonded to the back substrate surface. Electrically adhesive having a relatively high electrical conductivity, may be applied at top and bottom edges of the connector to electrically connect the foil segments. However, the connectors may optionally include metal contacts deposited adjacent top and bottom edges of the connector to enhance the electrical conductivity between the foil segments.

The metal contact is configured to electrically connect an endmost one of the n-type thermoelectric legs of one of the foil segments to an endmost one of the p-type thermoelectric legs of an adjacent one of the foil segments. In this manner, each one of the p-type thermoelectric legs is electrically connected to adjacent ones of the n-type thermoelectric legs at opposite ends of the p-type thermoelectric legs such that the n-type and p-type thermoelectric legs are electrically connected in series and thermally connected in parallel The foil assembly and/or foil segments are interposed between the bottom plate and the top plate in a spirally wound arrangement. The foil assembly is perpendicularly disposed between and in thermal contact with the bottom and top plates. A series of alternating n-type and p-type thermoelectric legs is disposed on a substrate of each one of the foil segments that make up the foil assembly in one embodiment of the thermoelectric generator. In another embodiment, the n-type and p-type thermoelectric legs are disposed on a single, elongate substrate of a single foil segment. The thermoelectric legs are generally fabricated from a bismuth telluride-type thermoelectric material.

The top plate is disposed in spaced relation above the bottom plate. The bottom and top plates may have a generally circular configuration and may be fabricated from any rigid material capable of suitable thermal conductance. In this regard, the top and bottom plate may be fabricated from ceramic material, metal material or any other suitable material or combination thereof. The bottom plate and top plate are configured to provide thermal contact between a heat sink and a heat source such that a temperature gradient may be developed across the alternating n-type and p-type thermoelectric legs.

Each one of the foil segments has a front substrate surface and a back substrate surface which opposes the front substrate surface. The spaced, alternating n-type and p-type thermoelectric legs are disposed in parallel arrangement to each other on the front substrate surface. Each of the n-type and p-type thermoelectric legs are formed of the thermoelectric material generally having a thickness in the range of from about 10 microns (μm) to about 100 μm with a generally thicker configuration being preferred due a correspondingly greater cross-sectional area providing concomitantly greater electrical current therethrough. The front substrate surface may have a surface roughness that is smoother than that of the back substrate surface in order to enhance the repeatability of forming the n-type and p-type thermoelectric legs on the front substrate surface. However, the back substrate surface may have the thermoelectric legs disposed thereupon and may be appropriately pre-treated prior to the deposition process.

Each one of the p-type and n-type thermoelectric leg pairs makes up a thermocouple of the thermoelectric generator. The width of the thermoelectric legs may be in the range of from about 10 μm to about 100 μm, the length thereof being in the range of from about 100 μm to about 500 μm. A preferred length of the n-type and p-type thermoelectric legs is about 500 μm. A preferred width of the n-type thermoelectric leg is about 60 μm while a preferred width of the p-type thermoelectric leg is about 40 μm. The geometry of the respective n-type and p-type thermoelectric legs may be adjusted to a certain extent depending on differences in electrical conductivities of each n-type and p-type thermoelectric leg.

Each one of the p-type thermoelectric legs is electrically connected to adjacent n-type thermoelectric legs at opposite ends of the p-type thermoelectric legs by a hot side metal bridge and a cold side metal bridge such that electrical current may flow through the thermoelectric legs from a bottom to a top of a p-type thermoelectric leg, or vice versa. The plurality of foil segments may preferably include a total of about 5000 thermocouples connected together and substantially evenly distributed on the array of foil segments and forming a thermocouple chain. However, any number of thermocouples may be provided in the thermoelectric generator.

Each of the thermocouples includes one n-type and one p-type thermoelectric leg. Thus, a thermoelectric generator having a chain of 5000 thermocouples will include 5000 n-type thermoelectric legs and 5000 p-type thermoelectric legs. The thermoelectric generator may preferably include any number of foil segments connected end-to-end to form the foil assembly. The foil assembly is thereafter spirally wound such that the front and back substrate surfaces of adjacently disposed wraps of the foil assembly are disposed in overlapping, but electrically non-conductive, contact with one another. A cover layer may be provided on at least one of the front and back substrate surfaces to prevent electrical conductance between the wraps of the foil assembly. The thermocouple chain may be connected to the top and bottom plates which, in turn, may be connected to an external load.

Each one of the hot side metal bridges and cold side metal bridges is configured to electrically connect an n-type thermoelectric leg to a p-type thermoelectric leg. Each one of the hot side and cold side metal bridges is also configured to act as a diffusion barrier in order to impede the diffusion of unwanted elements into the n-type and p-type thermoelectric legs which may be easily contaminated with foreign material. Additionally, each one of the hot side and cold side metal bridges is configured to impede the diffusion of unwanted elements out of the n-type and p-type thermoelectric legs. Finally, each one of the hot side and cold side metal bridges is configured to optimally conduct heat into and out of the p-type and n-type thermoelectric legs. In this regard, the hot side and cold side metal bridges may be fabricated of a highly thermally conductive material such as gold-plated nickel.

The substrate of each foil segment may have a thickness in the range of from about 7.5 μm to about 50 μm, although the thickness of the substrate is preferably about 25 μm. Because of the desire to reduce the thermal heat flux through the substrate in order to increase the efficiency of energy conversion, it is desirable to decrease the thickness of the substrate upon which the thermoelectric legs are disposed. An electrically insulating material with a low thermal conductivity such as polyimide film may be utilized for the substrate.

The thermoelectric film that makes up the n-type and p-type thermoelectric legs may be comprised of a semiconductor compound of the bismuth telluride ($Bi_2Te_3$) type. However, specific compositions of the semiconductor compound may be altered to enhance the thermoelectric performance of the n-type and p-type thermoelectric legs. Specifically, the composition of the n-type thermoelectric legs may include the elements Bismuth (Bi), Tellurium (Te) and Selenium (Se). The composition of the p-type thermoelectric legs may include the elements Bismuth (Bi), Antimony (Sb) and Tellurium (Te). Furthermore, excess of the elements Tellurium (Te) and Selenium (Se) may be provided in n-type material. Excess of the element Tellurium (Te) may be provided in p-type material. The amounts of excess of each of these elements may be altered in order to enhance the fabrication and power characteristics thereof.

In the method for producing the foil segment for the thermoelectric generator, magnetron sputtering may be utilized for deposition of a relatively thick "bismuth telluride type" thermoelectric material film onto the substrate. It should be noted that as known in the art, bismuth telluride refers to a specific material system and is referred to as such because the p-type and n-type materials are from the same bismuth telluride type. Due to a unique sputtering target composition, the sputtering regime, and post-annealing process, relatively high values for the power factor (P) of the thermoelectric material are achievable. For example, in one embodiment of the thermoelectric generator, an average value for the power factor ($P_p$) of p-type $Bi_2Te_3$-type thermoelectric material at room temperature is about 45 $\mu W/(K^2 \ast cm)$ while an average value for the power factor ($P_n$) for n-type $Bi_2Te_3$-type thermoelectric material at room temperature is about 45 $\mu W/(K^2 \ast cm)$.

BRIEF DESCRIPTION OF THE DRAWINGS

These as well as other features of the present invention will become more apparent upon reference to the drawings wherein:

FIG. 1 is a perspective view of a thermoelectric generator illustrating the arrangement of a plurality of foil segments of the present invention;

FIG. 2 is a cross-sectional side view of the thermoelectric generator taken along line 2-2 of FIG. 1 illustrating the arrangement of alternating n-type and p-type thermoelectric legs disposed on a substrate film of each of the foil segments;

DETAILED DESCRIPTION OF THE INVENTION

Figure 3:
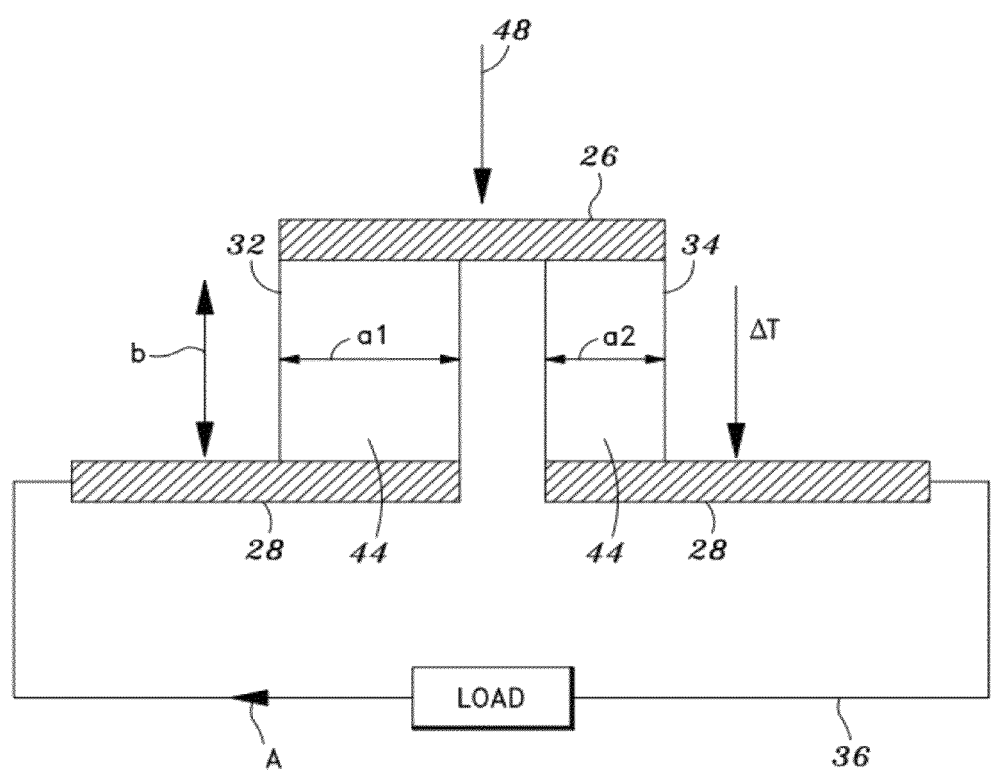
FIG. 3 is a schematic illustration of p-type and n-type thermoelectric leg pair that makes up a thermocouple of the thermoelectric generator.

Referring now to the drawings wherein the showings are for purposes of illustrating preferred embodiments and not for purposes of limiting the same, FIG. 1 is a perspective view of an embodiment of a thermoelectric generator 10 having a generally square-shaped and being comprised of a rectangular array of foil segments 16 in a vertically stacked arrangement.

The embodiment shown in FIG. 1 is the subject of U.S. patent application Ser. No. 11/185,312 entitled LOW POWER THERMOELECTRIC GENERATOR and filed on Jul. 20, 2005, and U.S. Pat. No. 6,958,443 filed on May 19, 2003 and entitled LOW POWER THERMOELECTRIC GENERATOR, the entire contents of each being expressly incorporated by reference herein in their entirety and each having the same assignee as the present application. FIG. 2 is a cross-sectional side view of the thermoelectric generator shown in FIG. 1 illustrating the arrangement of alternating n-type and p-type thermoelectric legs that are disposed on a substrate film of a series of foil segments as used in the thermoelectric generator disclosed herein. FIG. 3 is a schematic illustration of a typical p-type and n-type thermoelectric leg pair that makes up a thermocouple of the thermoelectric generator.

FIGS. 4a-7b illustrate the thermoelectric generator 10 in a further embodiment within which multiple foil segments 16 may joined end-to-end in a foil assembly 50 that is spirally wound into a circular shape. Importantly, such thermoelectric generator 10 achieves substantially greater power output than prior art thermoelectric generators due in part to a large reduction in electrical resistance, as will be described in greater detail below. As mentioned above, the thermoelectric generator 10 takes advantage of a thermal gradient to generate useful power under the Seebeck effect. FIGS. 8a-8f illustrate the improved power characteristics provided by the improved thermoelectric generator 10 under various temperature differences.

Referring still to FIGS. 4a-7b, the thermoelectric generator 10 is comprised of a generally round or disc-shaped bottom plate 12, a generally round or disc-shaped top plate 14, and series of foil segments 16 connected end-to-end to form a single, elongate foil assembly 50. Alternatively, a unitary, elongate foil segment 16 may be spirally wound into a circular shape eliminating the need to connect individual foil segments 16 end-to-end. The spirally wound foil assembly 50 may include a hollow core 82 as a result of the manufacturing process. The hollow core 82 may be adapted for use as a cavity to contain electronic circuitry such as power management circuitry. The round shape of the thermoelectric generator 10 enhances its adaptability with certain devices such as wearable microelectronic devices. For example, the thermoelectric generator 10 may be easily adapted for use in a wrist-watch or a device generally shaped liked a wristwatch.

For the configuration of the thermoelectric generator 10 wherein the foil assembly 50 is comprised of the series of foil segments 16, the foil assembly 50 is wound into the circular shape and then contained between the bottom plate 12 and the top plate 14. In this orientation, the foil assembly 50 and, hence, the foil segments 16 are perpendicularly disposed between and in thermal contact with the bottom and top plates 12, 14.

Each foil segment 16 is formed of an electrically non-conductive substrate 18 of preferably low thermal conductivity. A series of generally elongate, alternating n-type and p-type thermoelectric legs 32, 34 is disposed on a front substrate surface 40, back substrate surface 42, or both. As will be discussed in greater detail below, the thermoelectric legs 32, 34 are generally fabricated from a bismuth telluride-type thermoelectric material 44. The unique combination of material compositions for the substrate 18 and the thermoelectric material 44 provides a thermoelectric generator 10 having substantially improved power characteristics.

Figure 4A:
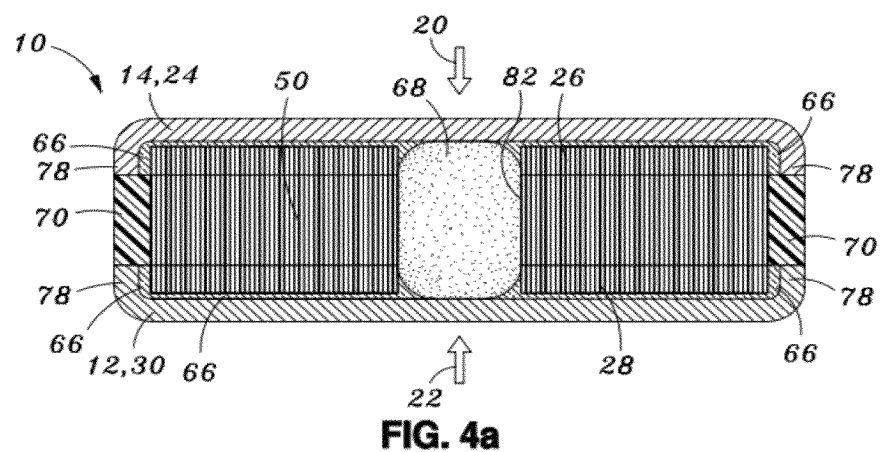
FIG. 4a is a cross-sectional view of a round shaped thermoelectric generator in an alternative embodiment and illustrating a spirally-wound foil assembly captured between a top plate and a bottom plate and illustrating filler material disposed within a central hollow core of the foil assembly.
Figure 4B:
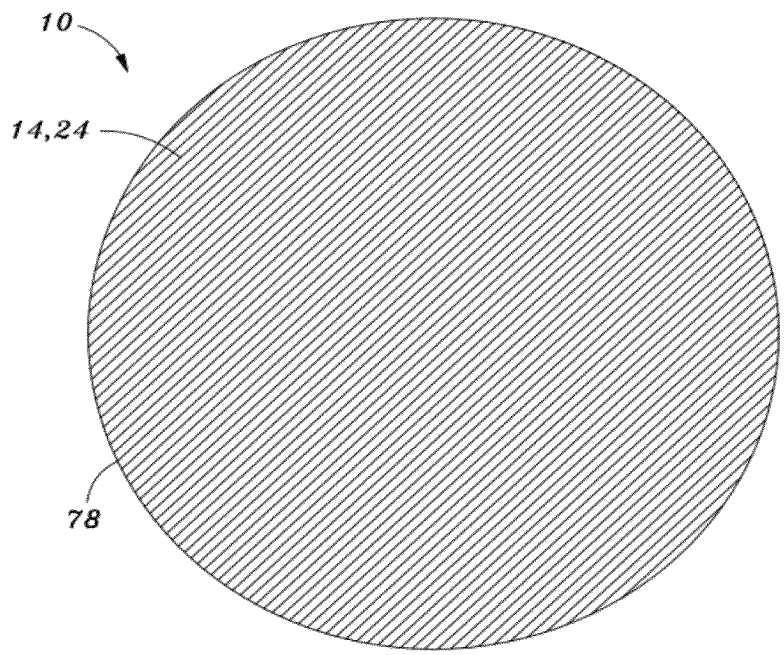
FIG. 4b is a top view of the thermoelectric generator of FIG. 4a and illustrating the circular shape of the top plate.
Figure 5A:
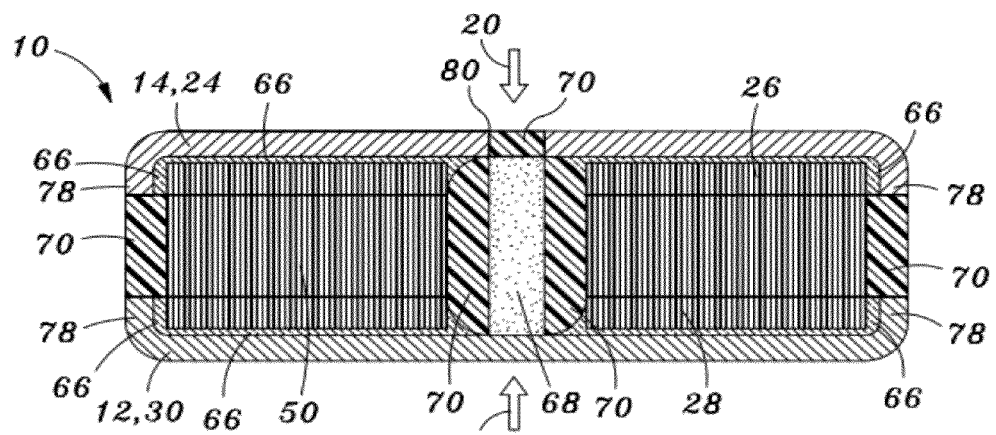
FIG. 5a is a cross-sectional view of the thermoelectric generator and illustrating a bore formed in the top plate and extending into the filler in the otherwise hollow core such as may be used for encapsulating electronic circuitry within the thermoelectric generator.
Figure 5B:
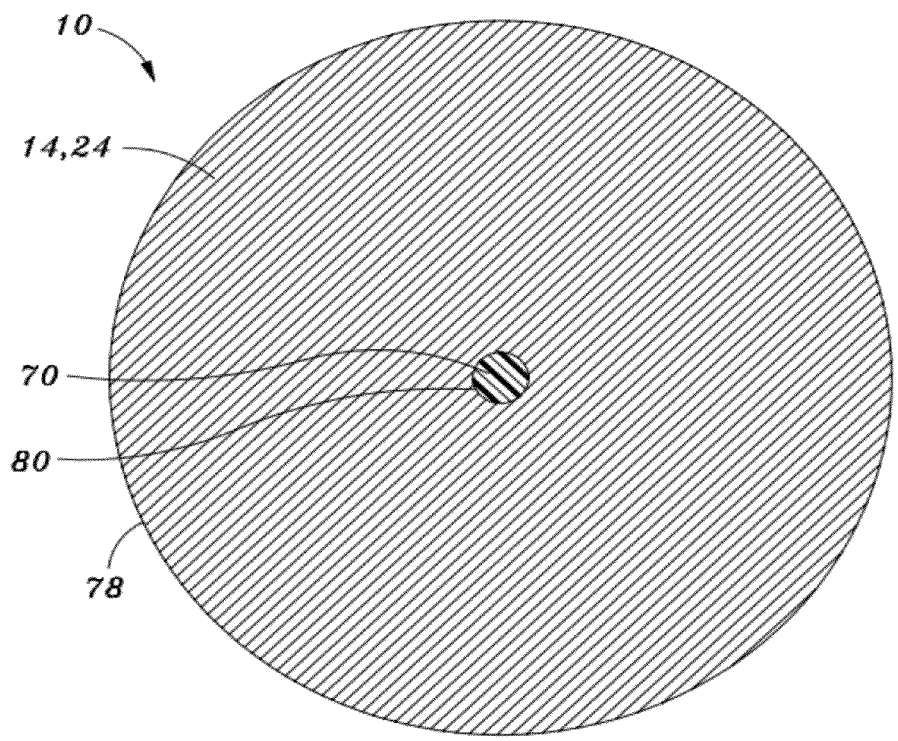
FIG. 5b is a top view of the thermoelectric generator shown in FIG. 5a and illustrating the centrally located bore formed in the top plate.

As may be seen in FIGS. 4b and 5b, the top plate 14 is disposed in spaced relation above the bottom plate 12. The bottom and top plates 12, 14 may have a generally circular or rounded shape. However, it will be recognized that the bottom and top plates 12, 14, which generally define the overall size of the thermoelectric generator 10, may be of any shape or configuration. In this regard, the generally rounded shape of the bottom and top plates 12, 14 may be easily adaptable for integrating the spirally wound series of foil segments 16. In one aspect, it is contemplated that the foil assembly 50 may be comprised of generally identically-configured foil segments 16 each having the same size and same arrangement of p-type and n-type thermoelectric legs 32 disposed thereupon. In this manner, the foil assembly 50 may be cost-effectively constructed of copies of foil segments 16 of the same size.

The bottom plate 12 and the top plate 14 may preferably be fabricated from any material that is substantially rigid and highly thermally conductive. For example, it is contemplated that metal and/or ceramic material may be utilized to fabricate the bottom and top plates 12, 14. The bottom plate 12 and top plate 14 may be configured to provide thermal contact between a heat sink 22 and a heat source 20, respectively, as can be seen in FIG. 1. The bottom and top plates 12, 14 are also configured to provide a protective housing such that the foil segments 16 are protected from mechanical contact and chemical influences. In this regard, sealant 70 may be provided on an outermost surface of the foil assembly 50 between the top and bottom plate 14, 12 such that the foil segments 16 are sealed against moisture, debris and other influences that may damage to or short-circuiting of the foil segments 16.

Referring now more particularly to FIGS. 4a to 7b, shown is the thermoelectric generator 10 having the foil assembly 50 captured between the disc-shaped top and bottom plates 14, 12. As can be seen in FIGS. 4a and 5a, the top and bottom plates 14, 12 may optionally include a perimeter flange 78 extending therearound. Such perimeter flange 78 may be intentionally provided or it may be the result of a manufacturing process wherein the top and bottom plates 14, 12 are manufactured in large quantity (i.e., high piece numbers) by utilizing common stamping and/or punching processes.

Such top and bottom plates 14, 12 may be stamped from thin metal material or metal foils and, as a result, may include a small edge burr (i.e., perimeter flange). Advantageously, the perimeter flange 78 may increase the stiffness and mechanical stability of the top and bottom plates 14, 12. Furthermore, the perimeter flange 78 may better contain the foil assembly 50 within the circumferential boundaries of the top and bottom plates 14, 12. Finally, the perimeter flange 78 may increase heat flow to and from the outermost portions of the foil assembly 50 at the location through metal bridges 26, 28 joining the pairs of n-type and p-type thermoelectric legs 32, 34 that are deposited on the foil assembly 50.

As was earlier mentioned, the top and bottom plates 14, 12 are preferably highly thermally conductive and, in this regard, act as heat couple plates in that their low thermal resistance preferably reduces thermal losses in thermoelectric generator 10. It is contemplated that the top and bottom plates 14, 12 may be fabricated of any suitable highly-thermally conductive material such as metal material including copper, aluminum, stainless steel, coated steel, and solderable metal alloys and various combinations thereof. Furthermore, the top and bottom plates 14, 12 may be fabricated of ceramic material which may optionally be combined with metal material. In this regard, ceramic may undergo a metallization process wherein a layer of metal is formed on a surface of the ceramic material. Depending upon the application of the thermoelectric generator, it may be desirable to increase the heat exchanging capabilities of at least one of the top and bottom plate. For example, at least one of the top and bottom plate may be provided with an enlarged surface area. Such enlarged surface area may be realized through the use of a cooling fin structure such that heat may be more readily dissipated or transferred to the surrounding environment.

Thin metal foils on the order of 50-250 μm (um) are preferably suitable as material for the top and bottom plates 14, 12 due to their low thermal resistance. Furthermore, such thin metal foil material may be easily converted into the top and bottom plates 14, 12 by simple manufacturing processes such as punching and stamping. As can be seen in FIG. 5b, at least one of the top and bottom plates 14, 12 may include a bore 80 passing therethrough and which may be centrally located and which may be utilized to enable integration or insertion of electronic circuitry within the hollow core 82 formed during the spiral-winding of the foil assembly 50.

Although configurable in any size, it is contemplated that the top and bottom plates 14, 12 may have a diameter in the range from about 4 millimeters (mm) to about 80 mm with a more preferable outer diameter of from about 5 mm to 25 mm and most preferably having an outer diameter of about 8 mm. The top and bottom plates 14, 12 are spaced apart to define an overall height of the thermoelectric generator 10 of between about 0.3 mm and about 4.0 mm dependant upon the overall height (i.e., width) of the substrate 18 material. More preferably, the height of the thermoelectric generator 10 is between about 0.5 mm to 2.0 mm and is most preferably about 1.0 mm in height. It is contemplated that both the top and bottom plates 14, 12 may be utilized as electrical contacts by which the thermoelectric generator 10 may be connected to a device to supply power. In this regard, one end of the series of n-type and p-type thermoelectric legs 32, 34 connected in series is preferably electrically connected to the top plate 12 while an opposite end of the series of n-type and p-type thermoelectric legs 32, 34 is connected to the bottom plate 12. Such electrical connected may be facilitated through the use of electrical adhesive 64. However, bonding and/or soldering and other suitable electrically conductive means may be utilized to connect the top and bottom plates 14, 12 to respective ones of the opposite ends of the n-type and p-type thermoelectric legs 32, 34 on the foil assembly 50. If the top and bottom plates 14, 12 are fabricated of non-conductive materials such as ceramic material, a pair of first and second electrical leads 24, 30 may be connected to opposite ends of the thermocouple chain in a manner similar to that disclosed in U.S. Pat. No. 6,958,443 and which was mentioned above. However, the top and/or bottom plates may be configured as metallized ceramic plates to act as heat conductors as well as serve as electrical contacts for the thermoelectric generator.

Shown in FIG. 2 is a representative view of at least a portion of one of the foil segments 16 that make up the foil assembly 50 and illustrating the arrangement of the alternating n-type and p-type thermoelectric legs 32, 34 disposed on the substrate 18. As was earlier mentioned, each one of the foil segments 16 has a front substrate surface 40 and a back substrate surface 42 opposing the front substrate surface 40. Upon winding of the foil assembly 50 following end-to-end connection of the foil segments 16, the back substrate surfaces 42 faces the front substrate surface 40 of adjacent wraps of foil segment 16.

The spaced, alternating n-type and p-type thermoelectric legs 32, 34 are disposed parallel to each other on either or both of the front and back substrate surface 40, 42. To prevent short-circuiting, a cover layer 72 of standard, positive photoresist material may be deposited over the foil segment 16 following deposition of the n-type and p-type thermoelectric legs 32, 34. The cover layer may be provided following the metallization process used to create metal contacts and metal bridges, if included on the substrate 18. Although the thermoelectric material 44 may have a thickness in the range of from about 10 microns (μm) to about 100 μm, a preferable thickness of the n-type thermoelectric material 44 is about 15 μm.

Turning briefly now to FIG. 3, shown is a schematic representation of the n-type and p-type thermoelectric leg 32, 34 pair that makes up a thermocouple 46 of the thermoelectric generator 10. As can be seen in FIG. 3, the n-type and p-type thermoelectric legs 32, 34 have a respective width. The n-type thermoelectric leg 32 width is denoted as $a_1$. The p-type thermoelectric leg 34 width is denoted as $a_2$. The thermoelectric leg 32, 34 length for both the n-type thermoelectric leg 32 and the p-type thermoelectric leg 34 is denoted as b. Although the n-type and p-type thermoelectric legs 32, 34 may have substantially equal lengths, it is contemplated that the thermoelectric generator 10 may be configured wherein the n-type and p-type thermoelectric legs 32, 34 are of differing lengths. Advantageously, the extreme aspect ratio of the length to the width allows the generation of relatively high thermoelectric voltages in the miniaturized thermoelectric generator 10.

The geometry of the respective ones of the n-type and p-type thermoelectric legs 32, 34 may be adjusted to a certain extent depending on differences in electrical conductivities of each of the n-type and p-type thermoelectric legs 32, 34. The width of the thermoelectric legs 32, 34 may be in the range of from about 10 μm to about 100 μm. The lengths of the thermoelectric legs 32, 34 may be in the range of from about 100 μm to about 500 μm. A preferred length b of the n-type and p-type thermoelectric legs 32, 34 is about 500 μm. A preferred width $a_1$ of the n-type thermoelectric leg 32 is about 60 μm while a preferred width $a_2$ of the p-type thermoelectric leg 34 is about 40 μm. The thermoelectric properties of the p-type thermoelectric leg 34 are typically superior to those of the n-type thermoelectric leg 32. Therefore, the width of the p-type thermoelectric legs 34 can be narrower than that of the n-type thermoelectric legs 32. Although the thermoelectric legs 32, 34 are shown in FIG. 2 as having an elongate configuration, it is contemplated that the thermoelectric legs 32, 34 may configured in numerous other configurations such as, for example, an L-shaped or S-shaped configuration.

The n-type and p-type thermoelectric legs 32, 34 are connected thermally in parallel and electrically in series. As illustrated schematically in FIG. 2, each one of the p-type thermoelectric legs 34 is electrically connected to an adjacent one of the n-type thermoelectric legs 32 at opposite ends of the p-type thermoelectric legs 34 by a hot side metal bridge 26 and a cold side metal bridge 28. In this manner, electrical current may flow through the thermoelectric legs 32, 34 from a bottom to a top of a p-type thermoelectric leg 34 and from a top to a bottom of an n-type thermoelectric leg 32. Each alternating one of the thermoelectric legs 32, 34 is connected to an adjacent one of the thermoelectric legs 32, 34 of opposite conductivity type, forming a thermocouple 46.

In FIG. 3, the representative n-type thermoelectric leg 32 is connected at a respective upper end thereof to a respective upper end of the p-type thermoelectric leg 34. In FIG. 2, a plurality of n-type and p-type thermoelectric legs 32, 34 are connected at opposite ends thereof forming a plurality of thermocouples 46 and leaving a free p-type thermoelectric leg 34 and a free n-type thermoelectric leg 32 on extreme opposite ends of each of the foil segments 16. Whenever heat is applied by the heat source 20 through the top plate 14 at the hot side metal bridge 26, a temperature gradient, indicated by the symbol ΔT, is created with respect to the cold side metal bridge 28 of the thermocouple 46 at the bottom plate 12 and heat sink 22 such that a heat flux 48 flows through the thermoelectric generator 10. Current then flows through a load in the electrical circuit 36 in the direction indicated by the symbol A. The thermoelectric generator 10 may further comprise a first electrical lead 24 and a second electrical lead 30 respectively connected to opposite ends of the series of n-type and p-type thermoelectric legs 32, 34 in the case where the top and bottom plate 14, 12 do not also serve as electrical contacts for the thermoelectric generator 10.

Each one of the hot side metal bridges 26 and cold side metal bridges 28 is configured to electrically connect an n-type thermoelectric leg 32 to a p-type thermoelectric leg 34. Each one of the hot side metal bridges 26 and cold side metal bridges 28 is also configured to act as a diffusion barrier in order to impede the diffusion of unwanted elements into the n-type and p-type thermoelectric legs 32, 34 which may be easily contaminated with foreign material. Furthermore, each one of the hot side metal bridges 26 and cold side metal bridges 28 is configured to impede the diffusion of unwanted elements out of the n-type and p-type thermoelectric legs 32, 34. Finally, each one of the hot side metal bridges 26 and cold side metal bridges 28 is configured to conduct heat into and out of the p-type and n-type thermoelectric legs 32, 34. In this regard, the hot side metal bridges 26 and cold side metal bridges 28 may be fabricated of a highly thermally conductive material such as gold-plated nickel.

Figure 6A:
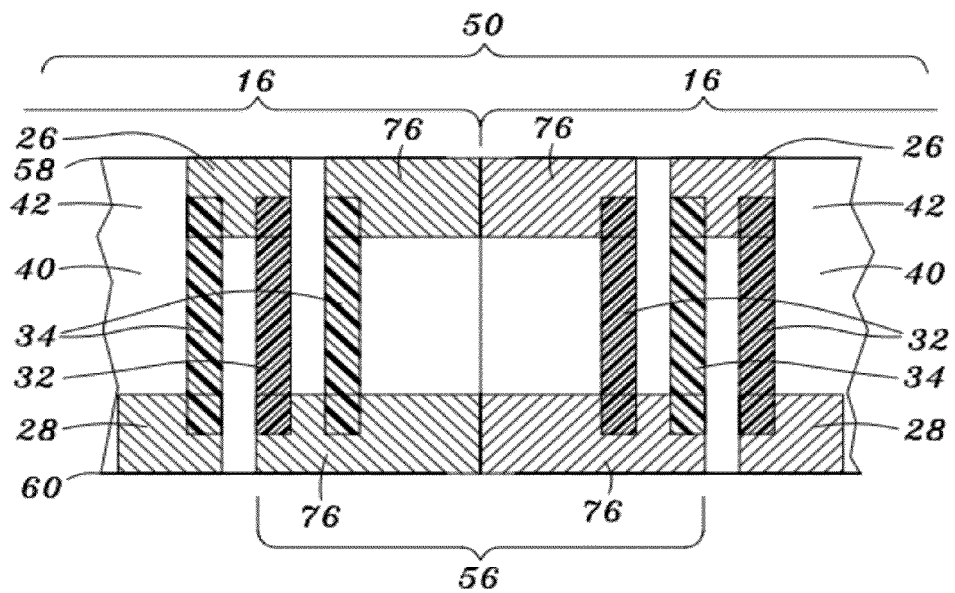
FIG. 6a is a side view of the foil assembly comprised of a pair of foil segments disposed in end to end contact and illustrating the configuration of end contacts adjacent free ends at top and bottom edges of each of the adjacently disposed foil segments as may be used for electrically connecting an endmost pair of n-type and p-type thermoelectric legs of one of the foil segments to an endmost of n-type and p-type thermoelectric legs of the adjacent one of the foil segments.
Figure 7A:
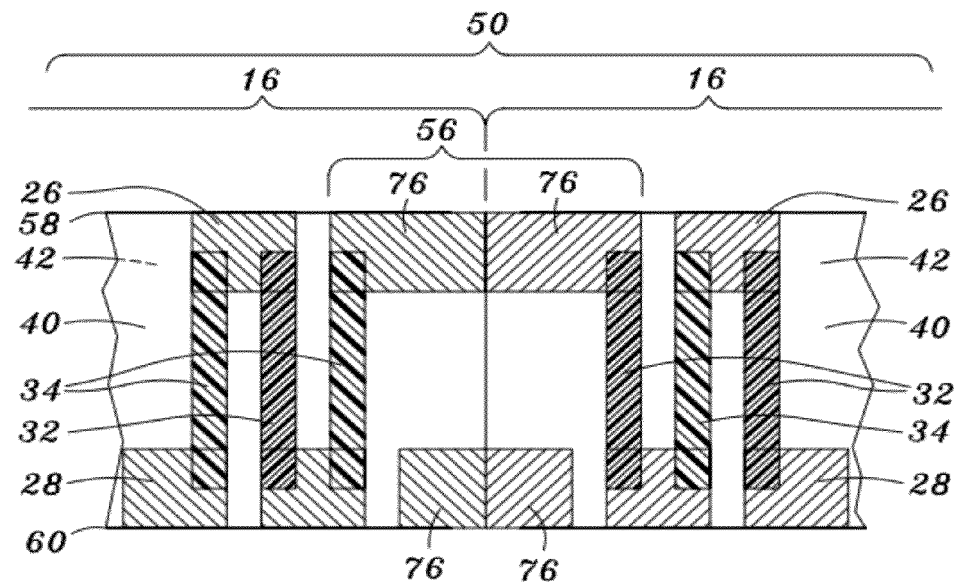
FIG. 7a is a side view of a pair of the foil segments disposed end-to-end with a "single" electrical connection between an endmost one of the end type thermoelectric legs of one of the foil segments to an endmost one of the p-type thermoelectric legs of the adjacent one of the foil segments.

In the illustration shown in FIGS. 2, 6a and 7a, the first electrical lead 24 is connected to a free end of the n-type thermoelectric leg 32 while the second electrical lead 30 is connected to a free end of the p-type thermoelectric leg 34. However, for the thermoelectric generator 10 having an array of foil segments 16 disposed in side-by-side arrangement as shown in FIG. 1, the foil segments 16 are electrically connected in series such that a free one of the n-type thermoelectric legs 32 on an extreme end of the foil segment 16 is electrically connected to a free one of the p-type thermoelectric legs 34 of an adjacent one of the foil segments 16, and vice versa. In such a configuration, the first electrical lead 24 is connected to a free end of the n-type thermoelectric leg 32 of a forward-most foil segment 16 of the array while the second electrical lead 30 is connected to a free end of the p-type thermoelectric leg 34 of the aft-most foil segment 16 of the array.

It is contemplated that the plurality of foil segments 16 of the foil assembly 50 may preferably include a total of about 5000 thermocouples 46 substantially evenly distributed on the array of foil segments 16 although it is contemplated that the thermoelectric generator 10 may comprise any number of thermocouples 46 from about 1000 to about 20,000. In the embodiment shown in FIG. 6a, a total of 5265 thermocouples 46 may be provided to account for the reduction in the quantity of effective thermocouples 46 due to electrical redundancy of the end-to-end connection between foil segments 16, as will be described in greater detail below.

In one embodiment, the thermoelectric generator 10 may include about nineteen (19) of the foil segments 16 connected end-to-end to create a foil assembly 50 having an overall length of about 1 meter. Alternatively, however, the thermoelectric generator 10 may include any number of foil segments 16 sufficient to integrate the total number of thermocouples 46 needed for producing the required power at the given operating temperatures. Assuming that all the thermocouples 46 are electrically connected in series, the total voltage output of the thermoelectric generator 10 is simply calculated as the sum of the individual voltages generated across each thermocouple 46, accounting for non-contributing thermocouples 46 as part of the electrically redundant connection type shown in FIG. 6a.

In a preferred embodiment, the substrate 18 has a thickness in the range of from about 7.5 μm to about 50 μm, although the thickness of the substrate 18 is preferably about 25 μm. Because of the desire to reduce the thermal heat flux 48 through the substrate 18 in order to increase the efficiency of energy conversion, it is desirable to decrease the thickness of the substrate 18 upon which the thermoelectric legs 32, 34 are disposed. Regarding the material that may comprise the substrate 18, an electrically insulating material may be utilized such that the adjacent ones of the thermoelectric legs 32, 34 disposed on the substrate 18 may be electrically insulated from one another.

The substrate 18 material may also have a low thermal conductivity and may be a polyimide film such as Kapton film made by DuPont. Due to its low thermal conductivity, polyimide film is an excellent substrate 18 for thermoelectric generators 10. In addition, polyimide film has a coefficient of thermal expansion that is within the same order of magnitude as that of the bismuth telluride-type material utilized in the thermoelectric legs 32, 34 in the room temperature range of about 70° F. Therefore, by utilizing polyimide film, the residual mechanical stresses that may occur at the substrate 18/thermoelectric material 44 interface may be minimized or eliminated. In this regard, the overall durability and useful life of the thermoelectric generator 10 may be enhanced.

The thermoelectric material 44 that makes up the n-type and p-type thermoelectric legs 32, 34 may be comprised of a semiconductor compound of the bismuth telluride ($Bi_2Te_3$) type, as was mentioned above. However, the specific compositions of the semiconductor compound may be altered to enhance the thermoelectric performance of the n-type and p-type thermoelectric leg 32, 34. In this regard, the semiconductor compound utilized as a starting material in depositing, such as by sputtering, of the p-type thermoelectric legs 34 32 may comprise a material having the formula:

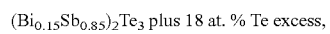

$(Bi_{0.15}Sb_{0.85})_2Te_3$ plus 18 at. % Te excess, although the excess may be in the range of from about 10 at. % Te excess to about 30 at. % Te excess.

The semiconductor compound (i.e., the starting material or target material) utilized in fabricating the n-type thermoelectric legs 32 via sputtering may preferably comprise a material having the formula:

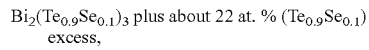

$Bi_2(Te_{0.9}Se_{0.1})_3$ plus about 22 at. % $(Te_{0.9}Se_{0.1})$ excess, although the excess may be anywhere within the range of from about 10 at. % $(Te_{0.9}Se_{0.1})$ excess to about 30 at. % $(Te_{0.9}Se_{0.1})$ excess. It should be noted that the above-recited compositions or formulae for the p-type and n-type thermoelectric material 44s are in relation to the initial or starting material from which sputtering targets are fabricated. In the fabrication method disclosed herein, the thermoelectric material 44 for the n-type and p-type legs is the starting material prior to the sputtering operation. The stoichiometric composition of the thermoelectric material 44 as disclosed herein advantageously results in a relatively high thermoelectric figure of merit (Z).

Although a number of different microfabrication techniques may be utilized in depositing the thermoelectric material 44 onto the substrate 18, the method of sputtering, such as magnetron or plasmatron sputtering, may preferably be utilized with the aid of high vacuum deposition equipment. Sputtering may be utilized for deposition of relatively thick bismuth telluride-based thermoelectric material 44 onto the thin substrates 18. When used in conjunction with the material system described above, significantly high power output is achievable with the thermoelectric generators 10 of the present invention. Such increased power output is due in part to the use of bismuth telluride-type material systems which have a relatively high figure of merit (Z) compared to other material systems in the room temperature range and which effectively operate in a range of from about 32° F. to about 212° F. (i.e., equivalent to a range of about 0° C. to about 100° C.).

As was earlier mentioned, the efficiency of thermoelectric generators 10 may be characterized by a thermoelectric figure of merit (Z), defined by the formula: $Z=S^2\sigma/\kappa$, where $\sigma$ and $\kappa$ are the electrical conductivity and thermal conductivity, respectively, and where S is the Seebeck coefficient expressed in microvolts per degree ($\mu$V/K). Z can be rewritten as P/$\kappa$ where P is the power factor. In the thermocouple 46 arrangement of the thermoelectric generator 10 disclosed herein invention, the direction of heat flow through the thermoelectric legs is parallel to the direction of heat flow through the substrate 18. Therefore, it may be preferable to consider the power factor as a measure of the effectiveness of the thermoelectric material 44.

Due to the unique material compositions of the thermoelectric legs of the present invention in combination with the deposition procedure, relatively high values for the power factor (P) of the thermoelectric material 44 were achieved. For example, it was discovered that depositing the $Bi_2Te_3$-type thermoelectric material 44 onto the substrate 18 by sputtering resulted in improved values for the power factor for both the p-type and n-type thermoelectric material 44 as compared to prior art arrangements.

More specifically, it was discovered that using the optimized sputtering procedure for the p-type $Bi_2Te_3$-type thermoelectric material 44, the Seebeck coefficient ($S_p$) was about 210 $\mu$V/K while the electrical conductivity ($\sigma_p$) was about 800 $1/(\Omega*cm)$ for a power factor ($P_p$) of about 35 $\mu$W/($K^2*cm$) in the room temperature range. For the n-type $Bi_2Te_3$-type thermoelectric material 44, the Seebeck coefficient ($S_n$) was about 180 $\mu$V/K while the electrical conductivity ($\sigma_n$) was about 700 $1/(\Omega*cm)$ for a power factor ($P_n$) of about 23 $\mu$W/($K^2*cm$) in the room temperature range. It should be noted that the thickness of the n-type thermoelectric leg 32 for the above-mentioned results was about 15 $\mu$m.

For the thermoelectric generator 10 having the above-noted mechanical and electrical properties, improvements in power output are realized and are documented in FIGS. 8a-8f. For example, for a temperature differential between the top and bottom plates 14, 12 of about 5K, open-circuit voltage output may be in the range of from about 4.0 V and about 6.5V with a measured value of about 5.2V. Likewise, short-circuit current output may be in the range of from about 60 $\mu$A and about 100 $\mu$A with a measured value of about 76 $\mu$A. The electrical power output in the case of a matched load for a preferred embodiment of the thermoelectric generator 10 is contemplated to be in the range of from about 70 $\mu$W and about 130 $\mu$W at a temperature differential between the top and bottom plates 14, 12 of about 5K and at a voltage of between about 2.0V to about 3.5V with a measure value of about 2.6V.

Figure 8A:
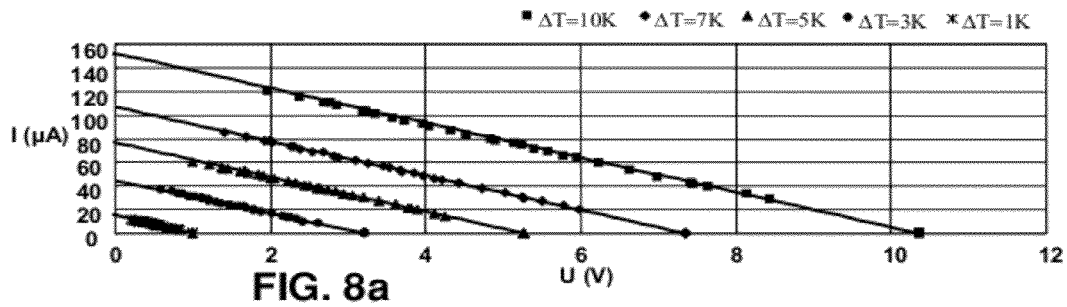
FIGS. 8a-8f are plots illustrating the power characteristics of the thermoelectric generator at varying temperature differentials between the top and bottom plates.
Figure 8B:
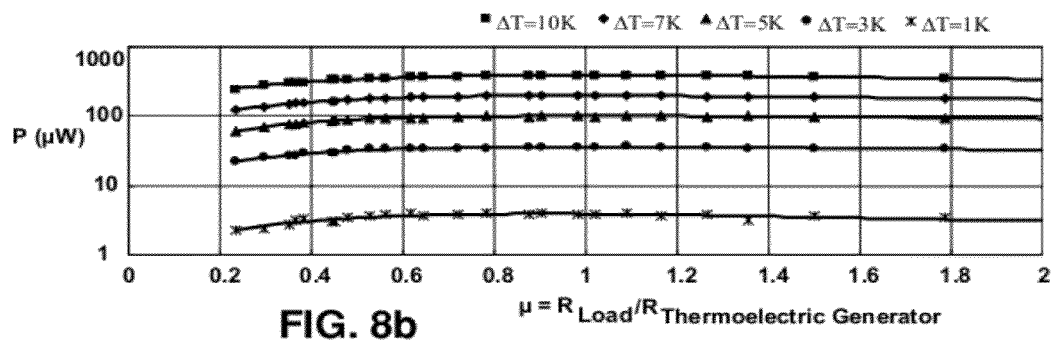
Figure 8C:
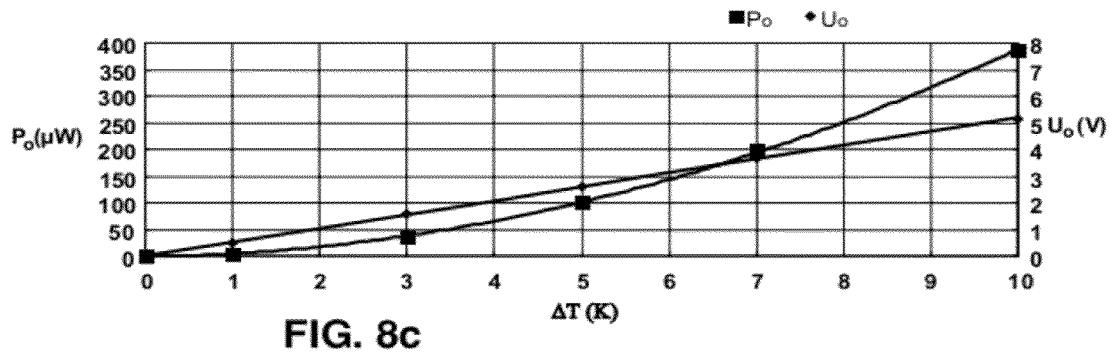
Figure 8D:
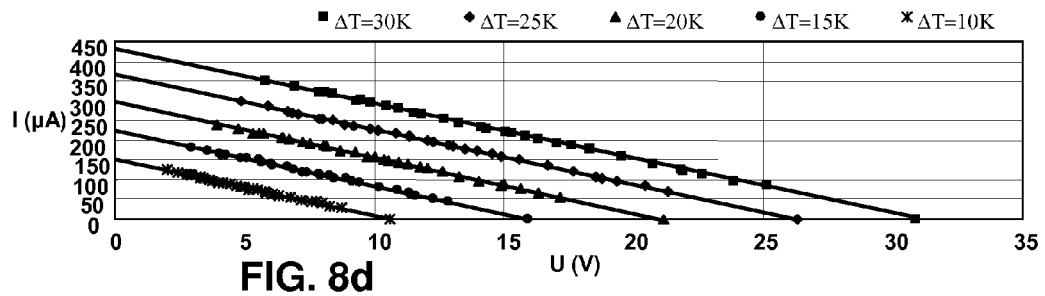

More particularly, as can be seen in FIGS. 8a-8f, power characteristics and electric parameters for the thermoelectric generator 10 vary according to the temperature differential between the top plate 14 and the bottom plate 14, 12. For example, FIGS. 8a and 8d are plots of electrical parameters of the thermoelectric generator 10 for various temperature differentials between the top and bottom plates 14, 12. More specifically, FIGS. 8a and 8d are plots of voltage in volts versus electrical current measured in microamps. As can be seen in FIG. 8a, the thermoelectric generator 10 provides an open circuit voltage of 5.2 volts and a short circuit electrical current output of 76.5 microamps ($\mu$A) at a temperature gradient of 5 K.

Figure 8E:
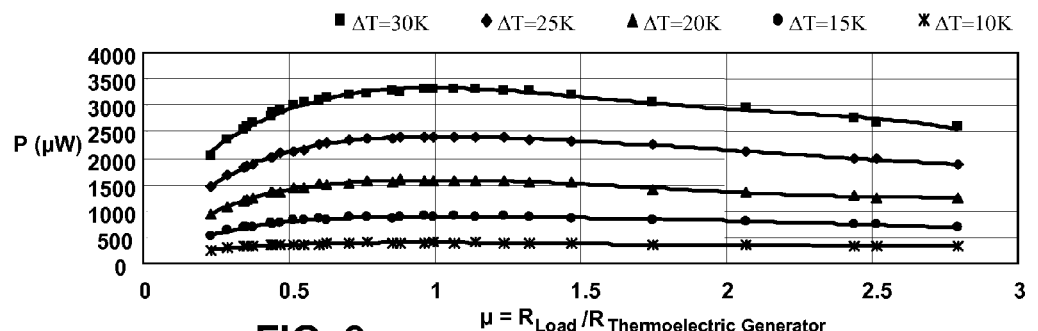
Figure 8F:
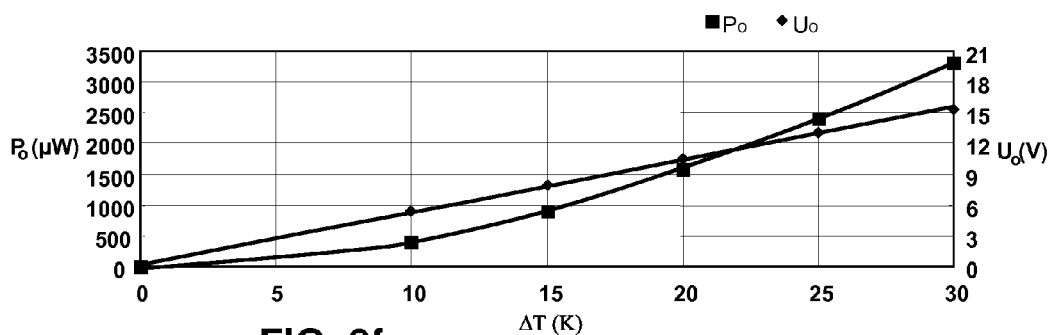

FIGS. 8b and 8e are plots of power output in the case of a matched load indicated on the plot as a ratio of resistance of a load over resistance of the thermoelectric generator 10. As can be seen in FIG. 8b, for the case or in the ratio of the resistance of the load to the resistance of the thermoelectric generator 10 is approximately 1, the electrical power output is almost 100 microwatts ($\mu$W) at a temperature differential of 5 K across the top and bottom plates 14, 12. Referring to FIGS. 8c and 8f, shown are plots of power output of the thermoelectric generator 10 at a match load (i.e., ratio of resistance of load to resistance of the thermoelectric generator 10 equals 1) to temperature difference across the top and bottom plates 14, 12. As can be seen in FIG. 8c, the thermoelectric generator 10 provides a voltage output of 2.6 volts at a temperature gradient of 5 K and a power output of 100 $\mu$W at such matched load. Such measurements as referenced in FIGS. 8a and 8f are taken at basic temperatures of 30° C. Furthermore, as can be seen by reference to 8c, both the power output and the voltage output of the thermoelectric generator 10 generally increase with the corresponding increase in the temperature gradient across the top and bottom plates 14, 12.

Referring now more particularly to FIGS. 6a to 7b, shown are several embodiments by which the end-to-end foil segments 16 may be mechanically and electrically connected. As was earlier mentioned, the foil assembly 50 may be comprised of a plurality of foil segments 16 disposed end-to-end mechanically and electrically connected to one another. Although the thermoelectric legs may be deposited on either one of the front or back substrate surfaces 40, 42 or on both of the substrate 18 surfaces, depositing on only the front substrate surface 40 may be advantageous in that the thermoelectric legs may be disposed in an inward direction when spirally wound which results in a lower thermo-mechanical tension on an inner side of the substrate 18 system.

Conversely, because the thermoelectric legs are deposited on the substrate 18 while the substrate 18 is in a flat or planar orientation followed by subsequent winding of the substrate 18 into a round package, relatively high mechanical stresses develop on an outer side (i.e., back substrate surface) as opposed to the mechanical forces generated on the inside (i.e., front substrate surface) of the foil segment 16 upon winding. Short circuiting between the wraps of the foil assembly 50 is prevented by providing a cover layer 72 on both sides of the stripes following deposition of the thermoelectric legs, as will be described in greater detail below.

The winding of the foil assembly 50 may include the creation of the hollow core 82 at a center thereof. It is contemplated that a minimum diameter for winding of the foil assembly 50 is about 1 mm which equates to an inner diameter of the hollow core 82. However, should the thermoelectric generator 10 be configured to contain or enclose certain components such as electronic circuitry, then the hollow core 82 may be enlarged to provide up to about 80 mm (e.g., size of a wristwatch or similar device) such that the foil assembly 50 is provided in more of a ring shape or doughnut shape.

Referring still to FIGS. 6a to 7b, end-to-end connection of the adjacent ones of the foil segments 16 may be facilitated through the use of a plurality of connectors 52 in the foil assembly 50. Each one of the connectors 52 may act as a splice across the joint between the adjacent foil segments 16 and, in this regard, may be disposed against at least one of the front and back substrate surfaces 40, 42. As was earlier mentioned, such additional mechanical stability is provided by bonding a connector to both the front and back substrate surfaces. The connectors 52 are configured to at least mechanically connect free ends of adjacent ones of the foil segments 16.

Figure 6B:
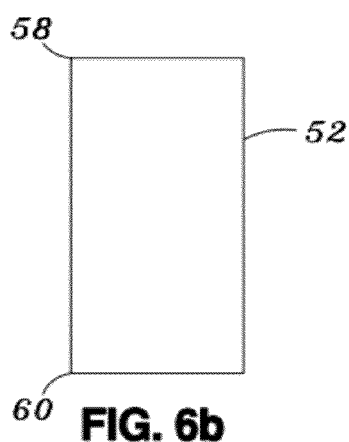
FIG. 6b is a plan view of a connector as may be utilized on at least one of the front and back substrate surfaces for splicing together adjacently disposed foil segments.

As can be seen in FIG. 6b, a connector 52 for purely mechanical connection of the back substrate surface and front substrate surface of end-to-end foil segments 16 is shown. Although the substrate 18 may include thermoelectric legs on both the front and back substrate surfaces 40, 42, if the back substrate surface 42 is void of thermoelectric legs, bonding of the connector 52 such as that shown in FIG. 6b is facilitated through the use of an assembly adhesive 62 which is preferably non-electrically conductive and of low thermal conductivity. Such assembly adhesive 62 is preferably UV or visible-light curable adhesive such as an epoxy or an acrylate glue. However, any suitable non-electrically conductive adhesive with low thermal conductivity and the proper mechanical parameters may be utilized.

Figure 6C:
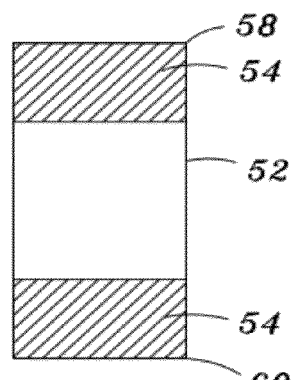
FIG. 6c is a plan view of an improved configuration of a connector having metal contacts disposed at top and bottom edges of the connector for improvement of the electrical connection between adjacently-disposed foil segments.

It is contemplated that the connectors 52 are fabricated of polyester foil or other suitable material which is of low thermal conductivity and which is also electrically non-conductive. The connector 52 may be fabricated of UV-transparent polyester foil material. The sizing of the connector 52 is preferably such that the connector 52 has a relatively small length which is measured from side-to-side as shown in FIGS. 6b and 6c. Such small length is desirable in the connector in order to reduce parasitic heat flux 48. However, mechanical stability between the foil segments 16 is enhanced through the use of a longer connector 52. An exemplary length of one of the connector 52 for bonding to the back substrate surface 42 is about 1500 μm although the connector 52 may be provided in any length. The connector 52 may be fabricated of polyester foil material having a thickness which is preferably less than that of the substrate 18 and more preferably which is about 12 μm.

Bonding of the connector 52 via the assembly adhesive 62 may be facilitated by pre-treatment of at least one side of the connector 52 in order to increase adhesion of the connector 52 to the assembly and electrical adhesive as well as to increase the adhesion between metal contacts 54 and the connector 52. Such metal contacts 54 are for electrically connecting the foil segments 16, as will be described in greater detail below. The connectors 52 are preferably of a height generally equivalent to that of the substrate 18 in order to facilitate interconnection between the foil segments 16. As can be seen in FIG. 6b, metal contacts 54 may be omitted from the connector 52 which is preferably installed on a side of the substrate 18 lacking thermoelectric legs. FIG. 6c illustrates a location and configuration of metal contact 54 which facilitates electrically connecting the thermoelectric legs.

Referring to FIG. 6c, shown is the connector 52 having the metal contacts 54 disposed thereupon. Such metal contacts 54 are preferably of a thickness within the range of one (1) μm to about five (5) μm nickel and may be covered by a thin (e.g., 100 nanometers (nm)) layer of gold which may be deposited by appropriate thin film (i.e., sputtering, thermal evaporation, etc.) processes or by thick film processes.

Referring now to FIGS. 6a and 7a, shown are adjacently disposed free ends of the foil segments 16 to be joined. In addition to the alternation n-type and p-type thermoelectric legs 32, 34 disposed on the substrate 18, the end contacts 76 are preferably included along top and bottom edges 58, 60 of the substrate 18 in order to provide a means for connecting the endmost ones of the n-type and p-type thermoelectric legs 32, 34 in each foil segment 16. In this regard, the end contact 76 provides a means for electrically connecting at least one of the n-type and p-type thermoelectric legs 32, 34 disposed adjacent the free ends of each of the foil segments 16.

The connectors 52 may be then used to provide a conductive path across the abutting end contacts 76 of the adjacent foil segments 16. In this regard, the metal contacts 54 may be similar in size to the hot side and cold side metal bridges 26, 28 that are used for interconnecting the n-type and p-type thermoelectric legs 32, 34 along the foil segments 16. The metal contacts 54 are sized and configured to electrically connect an endmost one of the n-type thermoelectric legs 32 of one of the foil segments 16 to an endmost one of the p-type thermoelectric legs 34 of an adjacent one of the foil segments 16. Such an arrangement is illustrated in FIG. 7a wherein the leftmost foil segment 16 includes a metal bridge at the top edge 58 connected to a p-type thermoelectric leg.

In FIG. 7a, the rightmost foil segment 16 includes a metal bridge at a top edge 58 of the foil segment 16 connecting the n-type thermoelectric leg 32. In addition, the bottom edge 60 of each one of the foil segments 16 includes the cold side metal bridge 28 which is not connected to any of the n-type or p-type thermoelectric legs 32, 34 but which is provided to balance the mechanical forces and create a symmetry of thickness between the top and bottom edges 58, 60 of the foil assembly 50 at the foil joints 56. Such symmetry thickness facilitates bonding of connectors 52 to the foil segments at the foil joint 56.

Figure 7B:
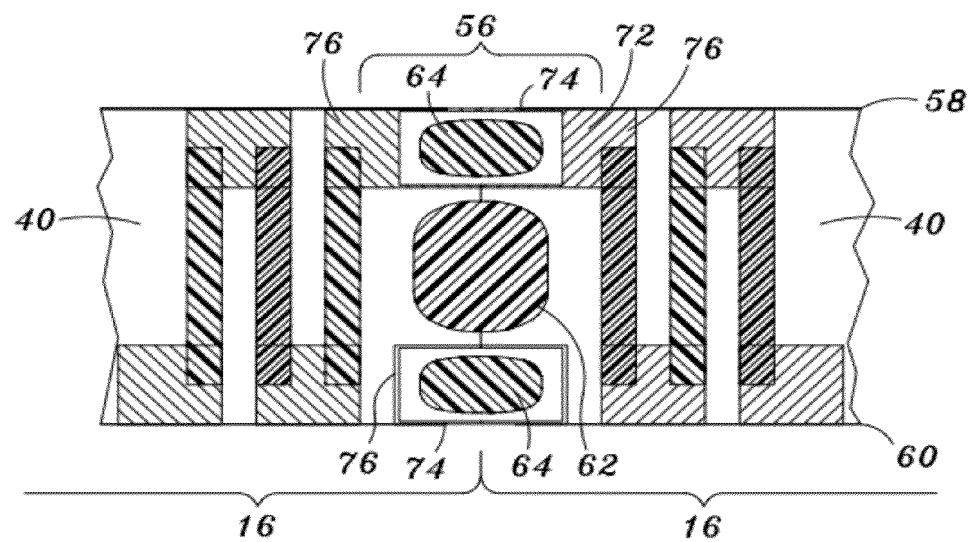
FIG. 7b is a side view of the foil segments shown in FIG. 7a and illustrating the location of the assembly adhesive and the electrical adhesive as may be used for mechanically and electrically adjoining the foil segments.

Referring briefly now to FIG. 7b, shown is a preferred embodiment for bonding of the connector 52 to the foil segment 16 in order to provide mechanical and electrical connection therebetween. More specifically, FIG. 7b illustrates a layer of assembly adhesive 62 disposed between the end contacts 76 of the top and bottom edges 58, 60, respectively. Such assembly adhesive 62 is preferably of low thermal conductivity and electrically non-conductive and is adapted to bond a middle portion of the connector 52 to at least one of the front and back substrate surfaces 40, 42 in order to mechanically connect the free ends of the adjacent foil segments 16. At the top and bottom edges 58, 60 along the end contacts 76 is a layer of electrical adhesive 64 which is preferably thermally low-conductive and which is configured to bond the metal contacts 54 at top and bottom edges 58, 60 of the connector 52 to respective ones of the end contacts 76 of the adjoining foil segments 16. Such electrical adhesive 64 is preferably UV or visible-light curable adhesive such as an epoxy or an acrylate glue. However, any suitable electrically conductive adhesive may be utilized with the proper mechanical parameters.

Figure 6D:
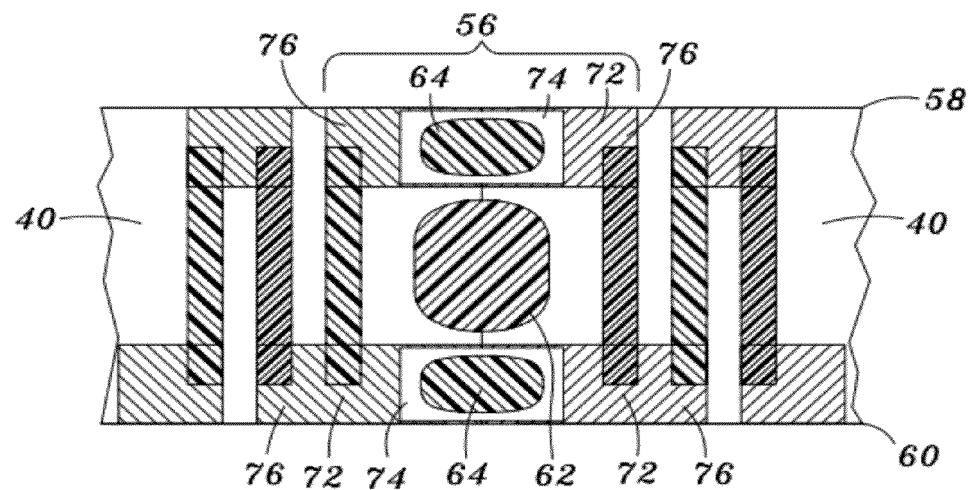
FIG. 6d is a side view of an adjacently disposed pair of foil segments and indicating a layer of assembly adhesive disposed approximately midway between the top and bottom edges of each of the foil segments and electrical adhesive disposed on respective ones of the end contacts of the adjacently disposed foil segments.

The configuration shown in FIG. 7b provides a method for simply connecting the endmost ones of the n-type and p-type thermoelectric legs 32, 34 electrically in series. However, in the interest of providing a redundancy in order to prevent failure of the thermoelectric device in the event of a poor electrical connection between both foil segments, an alternative joint configuration is shown in FIGS. 6a and 6d which increases redundancy of the electrical contact between the adjacent foil segments 16. More specifically, the joint configuration shown in FIG. 6a provides that the end contact 76 extends along at least one of the top and bottom edges 58, 60 adjacent to the free end of the foil segment 16.

The end contact 76 is preferably electrically connected to one of the n-type thermoelectric legs 32 and one of the p-type thermoelectric legs 34 which is disposed nearest the free end of the foil segment 16. Upon application of the connector 52 configuration shown in FIG. 6c, using the above described application of assembly and electrical adhesive 64s, at least one of the metal contacts 54 is configured to electrically connect an endmost pair of n-type and p-type thermoelectric legs 32, 34 of the leftmost foil segment 16 to an endmost pair of n-type and p-type thermoelectric legs 32, 34 of the right hand foil segment 16. Referring briefly to FIG. 6d, shown is the pattern by which the assembly and electrical adhesive 64 may be applied which is similar to that which is shown in FIG. 7b for the singly-redundant version of the foil joint 56.

Referring briefly to FIGS. 6d and 7b, shown therein are openings or windows 74 in the cover layer 72. As was earlier mentioned, the cover layer 72 is applied over the thermoelectric legs and substrate 18 following the deposition process. Such windows 74 may be created by appropriate masking or other suitable manufacturing step in order to locally eliminate the electrically non-conductive cover layer 72. The cover layer 72 is primarily intended to prevent electrical contact between successive wraps of the foil assembly 50 when spirally wound. Also, the cover layer 72 provides mechanical stabilization of the thermoelectric legs, protects against oxidation and corrosion, and limits chemical contact, etc. As can be seen in FIGS. 6d and 7b, such windows 74 may be configured to be slightly smaller than the size of the metal contact 54 of the connector 52 to which the end contacts 76 are to be electrically bonded.

For example, if the end contacts 76 and/or metal contacts 54 have a height of about 150 μm, it is contemplated that the windows 74 in the cover layer 72 over the end contacts 76 is about 120 μm in height. In this same regard, the window 74 may have a length of about 220 μm which is compatible to a length of the metal contacts 54 of the connectors 52. Regarding the general length of the connector 52, any suitable dimension can be provided but may preferably be about 500 μm for the connectors 52 having the metal contacts 54 deposited thereupon. As was earlier mentioned, the length of the connector 52 mounted on the back substrate surface 42 (i.e., which may lack thermoelectric legs) may be generally longer and may be on the order of about 1500 μm.

Referring back to FIGS. 4a and 5a, shown is a cross-sectional view of the thermoelectric generator 10 illustrating the wraps of foil segments 16 encapsulated between the top and bottom plates 14, 12. As was earlier mentioned, winding of the foil assembly 50 into the round package results in the generation of the hollow core 82 which is preferably filled with an electrically non-conductive filler 68 of low thermo conductance. Such filler 68 may act to prevent the creation of mechanical forces due to pressure differential created between the inside of the hollow core 82 and outside of the top and bottom plates 14, 12. Alternatively, FIG. 5a shows a bore 80 formed in at least one of the top and bottom plates 14, 12 to facilitate insertion of electronic circuitry or any other suitable components.

In the configuration shown in FIG. 5a, the electronic circuitry may be first inserted into the hollow core 82 and then filled with filler 68. Sealant 70 may also be provided on a perimeter of the hollow core 82 to prevent electrical and thermal conductance to the foil assembly 50. The filler 68 may be comprised of any suitable material and is preferably material having low thermal conductivity such as elastic or non-elastic material including adhesives and/or foams, hollow glass spheres (e.g., microballoons) or any mixture or combination thereof.

Regarding the electronic circuitry, such may be integrated into the thermoelectric generator 10 and may also be powered thereby to represent a portion of or a complete solution to an electronic power management system for a final electronic application of the thermoelectric generator 10. It is further contemplated that the spirally wound foil assembly 50 may form a ring around the electronic circuitry. In this manner, the overall size of the electronic circuitry is determinative of the minimum inner diameter of the hollow core 82. However, it is contemplated that additional electronic components which also form part of the electronic circuitry but which cannot be placed inside the hollow core 82 can instead be disposed and arranged outside of the thermoelectric generator 10 as a separate unit and may be mountable on the top and/or bottom plate 14, 12. In addition, a thin film battery may be deposited inside of at least one of the top and bottom plates 14, 12. In this manner, the top and bottom plates 14, 12 may act as a substrate for the thin film battery which may be adapted to fit within the hollow core 82. Alternatively, the thin film battery may be configured to extend across any or all portions of at least one of the top and bottom plates 14, 12.

Such electronic circuitry may comprise an electronic low power management system and/or the final electronic application and may include various devices such as a wristwatch, pulse/blood pressure meter and other medical devices, RFID devices, as well as sensor devices which may also be provided in RF technology format. Electronic circuitry in the form of power management systems may be integrated in order to process power generated by the thermoelectric generator 10 and also to provide a stable and buffered power source for the final electronic application. Ideally, the power management system itself should consume as little power as possible and may comprise the following features: excess voltage protection, energy storage, protection against reverse thermoelectric voltages and reverse electric currents, a rectifier to convert reverse thermoelectric voltages, low voltage protection for the electronic application, and energy storage management for the electronic application (i.e., wristwatch).

Excess voltage protection may be facilitated by means such as a diode or series of diodes connected in a forward direction and parallel to the final electronic application. Energy storage may be facilitated by means of various electronic components including a capacitor (low leakage, high capacity types and super capacitor types), or a rechargeable thin film battery or a combination of both devices. Protection against reverse voltages may be facilitated through the use of a diode having a low forward voltage, such as a Schottky diode, connected in a forward direction and in series with the thermoelectric generator 10.

The rectifier may be provided to convert reverse voltages and may be facilitated by the use of various components such as, for example, a Graetz-Bridge (e.g., an arrangement of four diodes) such that reverse thermoelectric voltages may be used to power certain electronic. In addition, the rectifier may facilitate blocking of reverse electric currents generated by an electronic low power management system and/or by the final electronic application.

Low voltage protection of the final electronic application may be facilitated through the use of a comparator circuit. Such comparator circuit may be configured to interrupt power produced by the thermoelectric generator 10 if an operating voltage of the final electronic application drops below a threshold voltage. Energy storage management may be critical for optimal usage of the thermoelectric generator 10. In this regard, it is desirable to configure such an energy storage management system such that power may be provided by the thermoelectric generator 10 when needed but energy may also be stored to prevent wasting of excess energy. It is contemplated that such energy storage management may be realized using an electronic circuit which provides energy in a storage capacity depending upon the voltage level requirements. Parts or the entire circuitry of an electronic low power management system may be facilitated as ASIC (i.e., Application-Specific Integrated Circuit) for enhancement of integration density and functionality and for reduction of power consumption.

Referring still to FIGS. 4a and 5a, the thermoelectric generator 10 may include a layer of sealant 70 extending around an outer circumferential portion of the foil segment 16 between the top and bottom plates 14, 12. Such sealant 70 is preferably electrically non-conductive and of low thermal conductance. Such sealant 70 is preferably configured to increase protection of the thermoelectric generator 10 against moisture absorption, corrosion, fluid contamination, debris as well as sealing against other undesirable elements. The sealant 70 may be applied to an outer area of the foil assembly 50 and also additionally in the hollow core 82 area as well to fill the bore 80 in any of the top or bottom plates 14, 12.

In manufacturing the thermoelectric generator 10 of the present invention, an initial step may include substrate 18 preparation and may comprise cutting the substrate 18 into the appropriately-sized pieces, followed by an annealing process and gluing of the substrate 18 onto frames for support thereon. Such substrate 18 may be any suitable material and is preferably Kapton Tape. After framing of the substrate 18 and following the annealing process, the p-type thermoelectric material 44 is deposited onto the substrate 18.

Such deposition step comprises preparation of a vacuum chamber and plasma etcher and insertion of target and wafer holders into the vacuum chamber. As was earlier mentioned, such p-type thermoelectric material 44 is preferably of the bismuth-telluride type with the above-described amounts of excess Te. Following plasma dry-etching, cold sputtering of the p-type thermoelectric material 44 is performed at room temperature. Hot sputtering is then performed in order to increase crystal growth of the p-type thermoelectric material 44. The hot and cold sputtering processes may be alternated any number of times (preferably three times each) in order to provide an optimal power factor for the deposited thermoelectric material 44. Following deposition of the p-type thermoelectric material 44, the photolithography of same is performed by application and structuring of photo resist. The p-type thermoelectric material 44 is then structured by etching followed by stripping of the photo resist.

Deposition of n-type thermoelectric material 44 is then performed in the vacuum chamber with a plasma etcher using targets of the appropriate bismuth-telluride material As was earlier mentioned, such n-type thermoelectric material 44 is preferably of the bismuth-telluride type with the above-described amounts of excess Te and Se. Alternating cold and hot sputtering may also be performed in order to provide an optimal layer of n-type thermoelectric material 44. Following photolithography and structuring by etching of the n-type thermoelectric material 44, lift-off photolithography is then performed followed by deposition of the nickel-gold layer for the hot and cold metal bridges 26, 28, the end contacts 76 of the foil segments 16, and the metal contacts 54 of the connectors 52. Following lift-off structuring, photolithography to generate the cover layer 72, annealing, and cutting of the wafer into foil segments 16, the foil segments 16 may be assembled end-to-end.

Figure 6E:
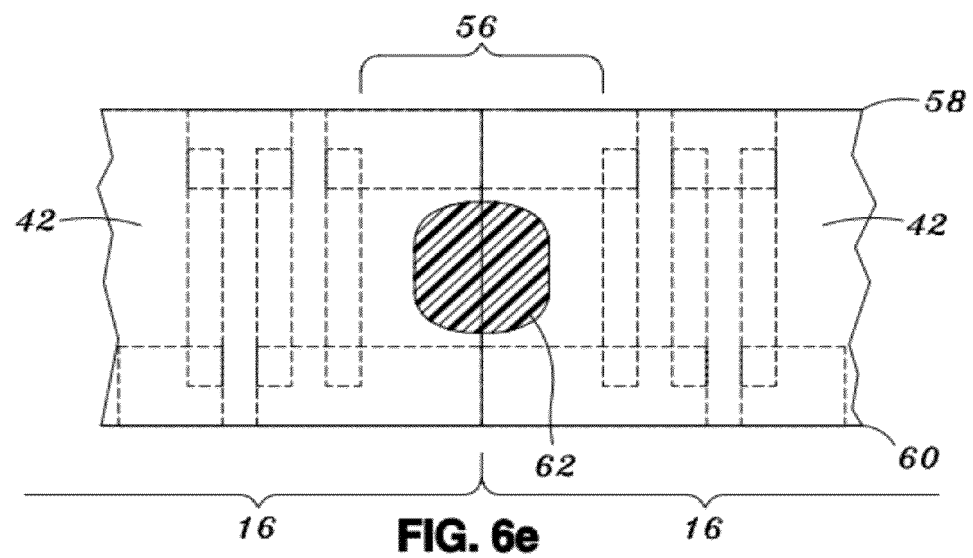
FIG. 6e is a side view of an opposite surface of the foil assembly from that which is shown in FIG. 6d and illustrating a layer of assembly adhesive disposed thereon for mechanically connecting the adjacently disposed foil segments with the connector (not shown)

The foil segment assembly process may be initiated with the adhesion of the connector 52 similar to that shown in FIG. 6b to at least one of the front and the back substrate surfaces 40, 42 using assembly adhesive 62 in the location shown in FIG. 6e. Mechanical and electrical connection of the foil segments 16 may then be performed by adhering the connector 52 shown as configured in FIG. 6c to the front substrate surface 40 wherein electrical adhesive 64 is applied to span between the endmost ones of the n-type and p-type thermoelectric legs of adjacently disposed foil segments. Alternatively, if end contacts 76 and metal contacts 54 are provided on the foil segments in the patterns shown in FIGS. 6d and 7b, electrical adhesive 64 may be applied to bond the metal contacts to at least one of the end contacts of one of the foil segments to improve the electrical connection. Such electrical adhesive 64 may be cured by any suitable means such as in an oven.

Following interconnection of the series of foil segments 16, the foil assembly 50 may be spirally wound into a round shape and may then be attached to the top and bottom plates 14, 12 such as by using thermal adhesive 66 which may be cured by any suitable means such as in a convection oven. Such thermal adhesive 66 may be UV or visible-light curable adhesive such as an epoxy or an acrylate glue, if the top or bottom plates 14, 12 consist of UV or visible-light transparent materials such as ceramics. However, any suitable non-electrically conductive adhesive with high thermal conductivity may be utilized with the proper mechanical parameters. The endmost ones of the metal end contacts at extreme opposite ends of the foil assembly 50 may then be connected to respective ones of the top and bottom plates 14, 12 such that the top and bottom plates 14, 12 may serve as electrical contacts for the device to be powered. Such contacts may be functionally and structurally similar to the contacts of a conventional wristwatch battery. Sealing of the device is then performed in order to protect the thermoelectric generator 10 against humidity, chemicals, mechanical influence and any other debris which may adversely affect its operation.

In an alternative manufacturing process, it is contemplated that an elongate foil segment may be fabricated for a thermoelectric generator using roll-to-roll processing techniques in order to deposit an array of n-type and p-type thermoelectric legs onto at least one of the front and back substrate surfaces of substrate material. Such roll-to-roll processing may be similar to that which is disclosed in U.S. Pat. No. 6,933,098 issued on Aug. 23, 2005 to Chan-Park, et al. and entitled PROCESS FOR ROLL-TO-ROLL MANUFACTURE OF A DISPLAY BY SYNCHRONIZED PHOTOLITHOGRAPHIC EXPOSURE ON A SUBSTRATE WEB, the entire contents of which is expressly incorporated herein by reference. Metal bridges and end contacts may likewise be deposited on at least one of the front and back substrate surfaces using a similar roll-to-roll processing techniques. Likewise, fabrication of the connectors that may either include or omit metal contacts may also be fabricated during such roll-to-roll processing.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. A method of producing a foil assembly for a thermoelectric generator, comprising the steps of:
   providing substrate material having front and back substrate surfaces;
   depositing an array of n-type and p-type thermoelectric legs onto at least one of the front and back substrate surfaces;
   depositing metal bridges on at least one of the front and back substrate surfaces to interconnect the n-type and p-type thermoelectric legs;
   cutting the substrate material having the n-type and p-type thermoelectric legs and metal bridges deposited thereon in such a manner to form a plurality of foil segments;
   providing at least one connector;
   aligning a pair of the foil segments in series for joining in end-to-end contact with one another to form a foil joint;

mechanically interconnecting the foil segments in end-to-end contact in the same plane with one another to form a single, elongate foil assembly by bonding the connector across the foil joint on at least one of the front and back substrate surfaces of the end-to-end foil segments with electrically non-conductive and thermally low conductive assembly adhesive; and electrically interconnecting the foil segments on at least one of the front and back substrate surfaces in an electrically redundant manner using electrically conductive adhesive to electrically connect an endmost pair of the n-type and p-type thermoelectric legs of one of the foil segments to an endmost pair of the n-type and p-type thermoelectric legs of an adjacent one of the foil segments along at least one of the top and bottom edges of the foil segments; and spirally winding the foil assembly into a generally round shape.

2. The method of claim 1, wherein:

the front substrate surface of the foil segments face radially inwardly.

3. The method of claim 1 wherein:

the n-type and p-type thermoelectric legs are deposited onto the substrate using a series of alternating hot and cold sputtering steps;

the cold sputtering step being performed at a temperature of in the range of from about 10° Celsius to about 100° Celsius;

the hot sputtering step being performed at a temperature in the range of from about 200° Celsius to about 400° Celsius.

4. The method of claim 1 further comprising the step of:

depositing metal contacts along at least one of top and bottom edges of the connector by sputtering a layer of nickel onto the connector followed by evaporation of a layer of gold onto the nickel layer.

5. The method of claim 1 further comprising the step of:

depositing end contacts along at least one of the top and bottom edges of at least one of the front and back substrate surfaces of the foil segments at opposing free ends thereof.

6. The method of claim 1 further comprising the step of:

cutting the substrate material to form the connector.

* * * * *